United States Patent
Champion et al.

(10) Patent No.: US 6,805,248 B2
(45) Date of Patent: Oct. 19, 2004

(54) ELECTRICAL EQUIPMENT RACK AND CABLE MANAGEMENT ARM ASSEMBLY

(75) Inventors: David Frederick Champion, Durham, NC (US); Edward John McNulty, Raleigh, NC (US); Charles Edmond White, III, Raleigh, NC (US); Kevin Lavern Schultz, Raleigh, NC (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/160,308

(22) Filed: May 31, 2002

(65) Prior Publication Data

US 2003/0222034 A1 Dec. 4, 2003

(51) Int. Cl.$^7$ .................................................. A47F 7/00
(52) U.S. Cl. ......................................... 211/26; 361/826
(58) Field of Search ........................... 211/26, 175, 189, 211/192, 195; 361/826, 829, 683, 727; 312/223.1, 223.2, 265.1; 248/637, 646, 674

(56) References Cited

U.S. PATENT DOCUMENTS

| | | | |
|---|---|---|---|
| 3,295,905 A | * 1/1967 | Sisk et al. .................. 312/273 |
| 3,710,199 A | * 1/1973 | Cignoni, Jr. ................ 361/827 |
| 4,614,383 A | * 9/1986 | Polley et al. ............... 312/273 |
| 5,303,101 A | 4/1994 | Hatch et al. |
| 5,377,065 A | 12/1994 | Morehouse et al. |
| 5,404,257 A | 4/1995 | Alt |
| 5,460,441 A | * 10/1995 | Hastings et al. ............. 312/298 |
| 5,571,256 A | * 11/1996 | Good et al. ................. 211/26 |
| 5,587,877 A | * 12/1996 | Ryan et al. .................. 361/683 |
| 5,636,090 A | 6/1997 | Boigenzahn et al. |
| 5,765,698 A | * 6/1998 | Bullivant ..................... 211/26 |
| 5,859,751 A | 1/1999 | Tacklind |
| 6,021,047 A | * 2/2000 | Lopez et al. ................ 361/727 |
| 6,070,742 A | * 6/2000 | McAnally et al. ........... 211/26 |
| 6,091,587 A | 7/2000 | Hatch et al. |
| 6,142,590 A | * 11/2000 | Harwell ..................... 312/223.1 |
| 6,163,440 A | 12/2000 | Takahashi et al. |
| 6,185,074 B1 | 2/2001 | Wang et al. |
| 6,305,556 B1 | * 10/2001 | Mayer ......................... 211/26 |
| 6,327,139 B1 | * 12/2001 | Champion et al. .......... 361/608 |
| 6,392,149 B1 | * 5/2002 | Kim et al. ................. 174/72 A |
| 6,435,354 B1 | * 8/2002 | Gray et al. .................. 211/26 |
| 6,442,030 B1 | * 8/2002 | Mammoser et al. ........ 361/727 |
| 6,523,918 B1 | * 2/2003 | Baiza ....................... 312/265.1 |
| 2003/0026084 A1 | * 2/2003 | Lauchner .................... 361/826 |

* cited by examiner

Primary Examiner—Jennifer E. Novosad

(57) ABSTRACT

A cable arm assembly manages cables between an equipment rack and an equipment unit slidably installed in the equipment rack. The assembly includes two cable arms, each having an offset bracket at one end, which are pivotally joined to provide a minimum bend radius for cables. A first hinge plate is pivotally attached between the first cable arm and a rack mounted bracket. A second hinge plate is pivotally attached between the second cable arm and a bracket mounted on the equipment unit. Fingers extending from the hinge plates limit the pivotal movement of each plate with respect to its bracket. The finger on the first plate prevents the arm assembly from hitting the opposite side of the rack as the equipment unit is sliding forward. The finger on the second plate prevents the two arms from locking when the equipment unit is extended fully forward.

18 Claims, 4 Drawing Sheets

ELECTRICAL EQUIPMENT RACK AND CABLE MANAGEMENT ARM ASSEMBLY

BACKGROUND OF THE INVENTION

This invention pertains to computers, as well as information processing, electronic and other electrical systems and, more particularly, to a cable management arm for managing electrical, optical, pneumatic and other cables suitable for interconnecting an equipment rack with an individual equipment unit contained in the rack.

A typical equipment rack is frame or housing that accepts one or more individual units of electrical equipment that are stacked one above the other, although racks with side-by-side mounted equipment units are also common. Equipment racks are usually, but not necessarily, floor standing. Each of these individual equipment units may be mounted on a pair of drawer slides, so that each unit can be slidably removed from the rack for servicing or other reasons.

Electrical, optical, pneumatic or other types of cables usually interconnect each equipment unit in the rack to other equipment units and systems, either within the same rack or external to the rack. Rather than directly route cables from one equipment unit to another, cables are typically routed from the first equipment unit to the rack, along the rack to a point adjacent the second equipment unit, and then from the rack to the second unit. When routing cables from the rack to the equipment unit, a cable management arm is typically used. A cable management arm functions to guide the cables as the equipment unit is sliding in and out of the rack, and prevents pinching of the cables between the equipment unit and the rack.

SUMMARY OF THE INVENTION

Briefly, in one embodiment the invention is an electrical equipment rack assembly including an electrical equipment rack having a rack attachment bracket. An electrical equipment unit is slidably attached to the rack and has a fully inserted position and a fully extended position. The equipment unit also includes a unit attachment bracket. A cable arm assembly has normal, service and extended positions. The cable arm assembly includes a first and second cable arms each having first and second ends. A first joint pivotally attaches the first end of the first cable arm to the first end of the second cable arm. A first hinge plate has first and second ends. The first end of the first hinge plate is pivotally attached to the rack bracket, and the second end of the first hinge plate is pivotally attached to the second end of the first cable arm. A second hinge plate also has first and second ends. The first end of the second hinge plate is pivotally attached to the unit bracket, and the second end of the second hinge plate is pivotally attached to the second end of the second cable arm. The first hinge plate includes a first stop means for limiting the rotation of the first hinge plate relative to the rack bracket. When the equipment unit is in the fully inserted position, the cable arm assembly can be positioned in either the normal position wherein the cable arm assembly is positioned adjacent the equipment unit, or in the service position wherein the cable arm assembly is positioned away from the equipment unit. When the equipment unit is in the fully extended position, the cable arm assembly is in the extended position.

In another embodiment, the invention is a cable arm assembly for use with an electrical equipment rack including a rack attachment bracket and an electrical equipment unit slidably attached to the rack wherein the equipment unit includes a unit attachment bracket. The cable arm assembly includes first and second cable arms each having first and second ends. A first joint pivotally attaches the first end of the first cable arm to the first end of the second cable arm. A first hinge plate has first and second ends. The first end of the first hinge plate is pivotally attachable to the rack attachment bracket and the second end of the first hinge plate is pivotally attached to the second end of the first cable arm. A second hinge plate also has first and second ends. The first end of the second hinge plate is pivotally attachable to the unit attachment bracket and the second end of the second hinge plate is pivotally attached to the second end of the second cable arm. The first hinge plate includes a first stop means for limiting the rotation of the first hinge plate relative to the rack attachment bracket.

DESCRIPTION OF THE ILLUSTRATIVE EMBODIMENTS

Figure 1:
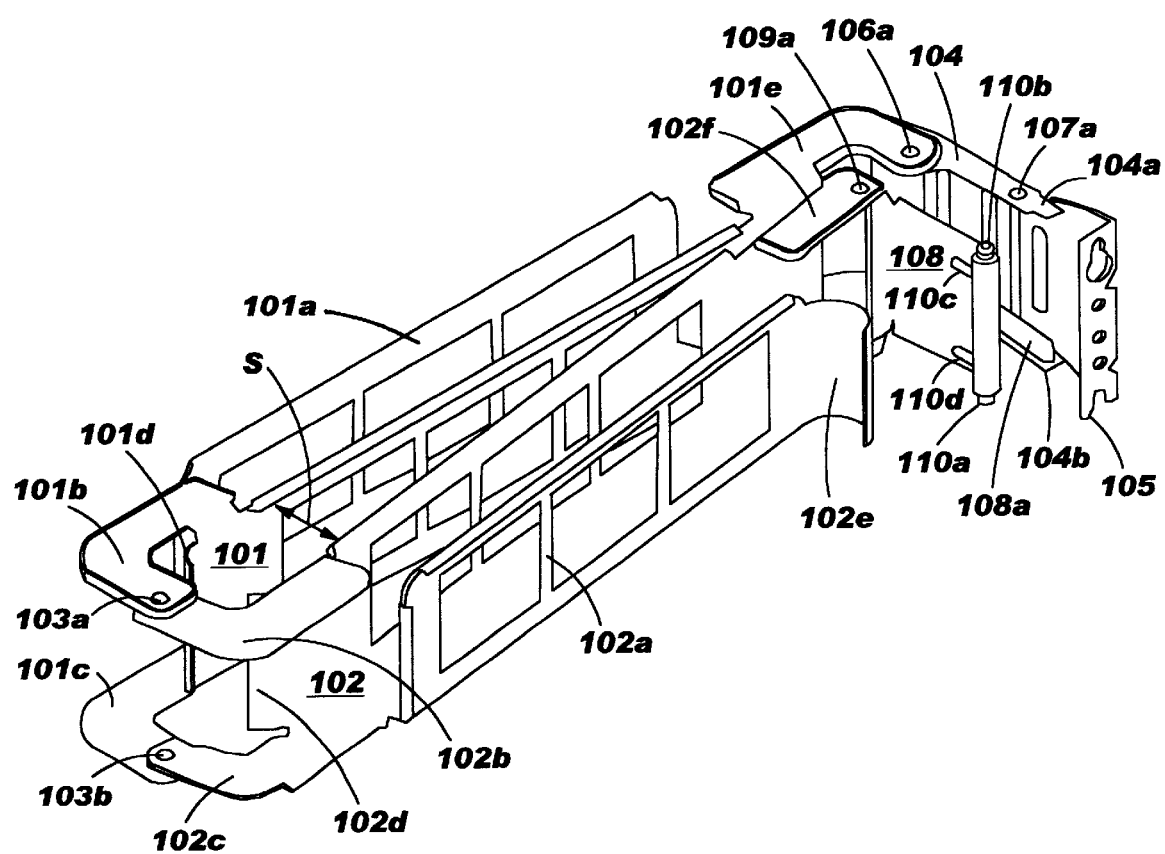
FIG. 1 is a perspective view of the cable management arm assembly.

In FIG. 1, cable arms 101 and 102 are preferably made of steel or other metal and are preferably formed by stamping, although other materials and shaping processes may also be used. Each cable arm 101 and 102 has a cable tray 101a and 102a, respectively, which are "U" shaped channels into which cables may be inserted. An offset bracket comprised of two "L" shaped brackets 101b and 101c are formed at a first end of cable arm 101 and, similarly, an offset bracket comprised of two "L" shaped brackets 102b and 102c are formed at a first end of cable arm 102. While "L" shaped brackets are preferred to form each of the offset brackets, other shapes may be used that result in an offset distance "S" between cable arm 101 and cable arm 102. The offset distance "S" should be equal to or greater than twice the minimum bend radius of any cable that may attached to the cable management arm assembly. Two curved guide surfaces 101d and 102d guide the cables around the pivotal joint at the first end of cable arms 101 and 102. The preferred radius for guide surfaces 101d and 102d, as well as guide surface 102e at the opposite end of cable arm 102, is S/2. Hinge pins 103a and 103b, preferably in the form of rivets, pivotally join the two offset plates together forming a pivotal joint at the first end of cable arms 101 and 102.

Two brackets 101e and 101f (101f is visible in FIG. 2) are formed at the second end of cable arm 101. A first hinge plate 104 is pivotally attached to brackets 101e and 101f with hinge pins 106a and 106b (hinge pin 106b is visible in FIG. 2), which are preferably rivets. A rack bracket 105 is provided for connecting one end of the cable management arm assembly to an equipment rack. Hinge pins 107a and 107b (pin 107b is visible in FIG. 4) pivotally attach hinge plate 104 to rack bracket 105. Fingers 104a and 104b provide a stop means to limit the rotational range of hinge plate 104 about rack bracket 105. The advantages of the stop means can best be understood with respect to FIG. 2, which is described below. While the stop means is preferably a finger or tab extending from hinge plate 104, any other means for limiting the rotation of the hinge plate with respect to rack bracket 105 may be used.

Two brackets 102f and 102g (102g is visible in FIG. 3) are formed at the second end of cable arm 102. A hinge plate 108 is pivotally attached to brackets 102f and 102g with hinge pins 109a and 109b (hinge pin 109b is visible in FIG. 3), which are preferably rivets. An equipment unit bracket 111 (visible in FIGS. 2–4) is provided for connecting one end of the cable management arm assembly to an equipment unit in an equipment rack. Hinge pins 110a and 110b pivotally attach hinge plate 108 to equipment unit bracket 111. Hinge pins 110a and 110b can be easily retracted by moving levers 110c and 110d together, such as by squeezing between the thumb and index finger, to quickly detach this end of the cable management arm assembly from the equipment unit. Other types of quick release mechanisms may also be used. Fingers 108a provides a stop means to limit the rotational range of hinge plate 108 about equipment unit bracket 111. The advantages of the stop means can best be understood with respect to FIG. 2, which is described below. While the stop means is preferably a finger or tab extending from hinge plate 108, any other means for limiting the rotation of the hinge plate with respect to the equipment unit bracket 105 may be used.

Figure 2:
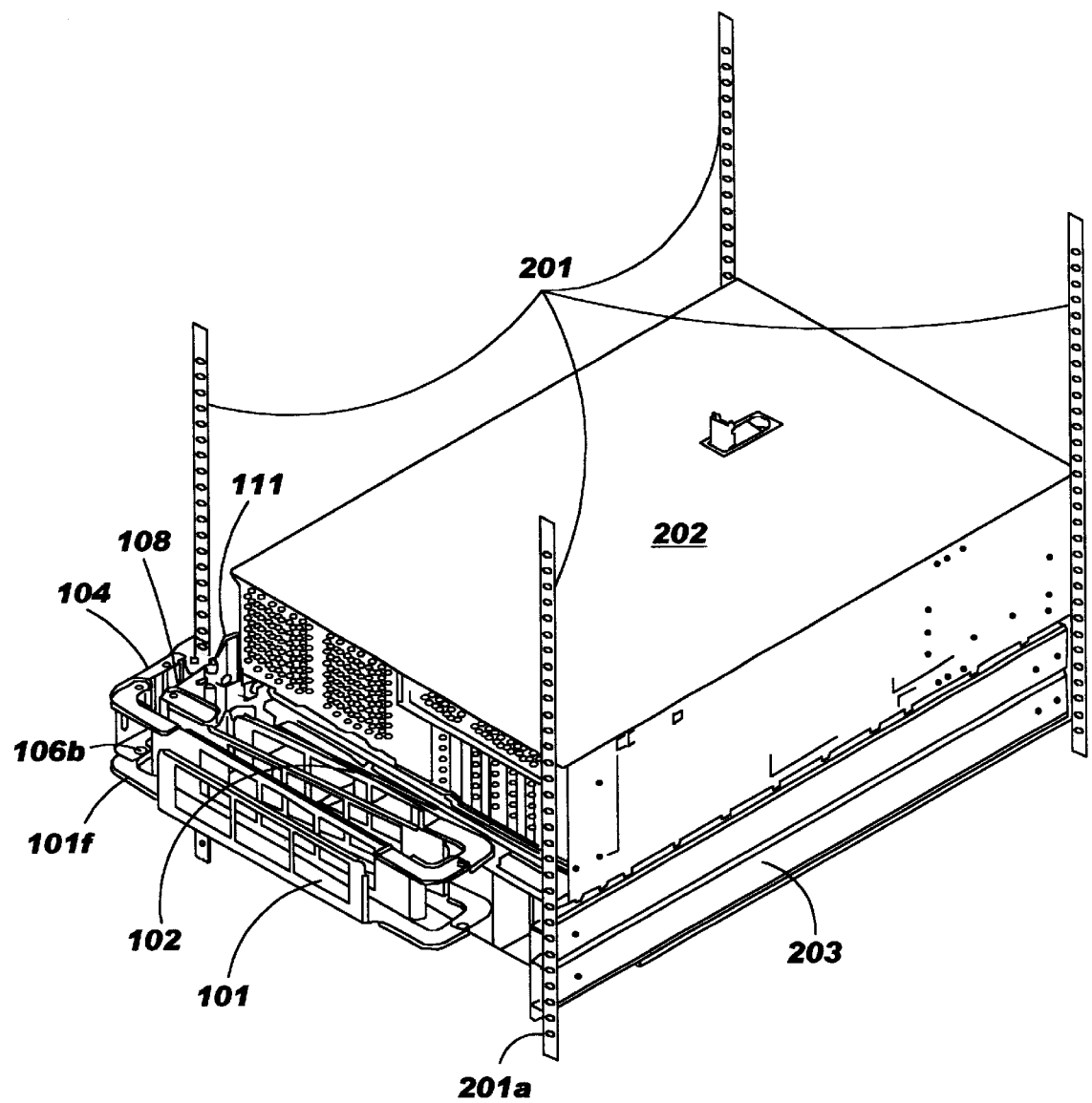
FIG. 2 is a perspective view of an equipment rack, cable management arm assembly, and an equipment unit slidably attached and fully inserted into to the equipment rack with the cable management arm assembly shown in its "normal" operating position, which is rotated towards the back of the equipment unit.

FIG. 2 is a perspective view of a rack and equipment unit in which the equipment unit is in the fully inserted position and the cable management arm assembly is in the "normal" position. Referring to this figure, a well known electrical equipment rack 201 provides a housing for a plurality of individual units of equipment in which the individual units of equipment may be stacked one above the other, although the invention may also be used in a rack in which the equipment units are placed side-by-side. Each equipment unit 202, which may be a computer, server, or other item of electrical equipment, is slidably mounted in rack 201 using drawer slides 203.

Figure 4:
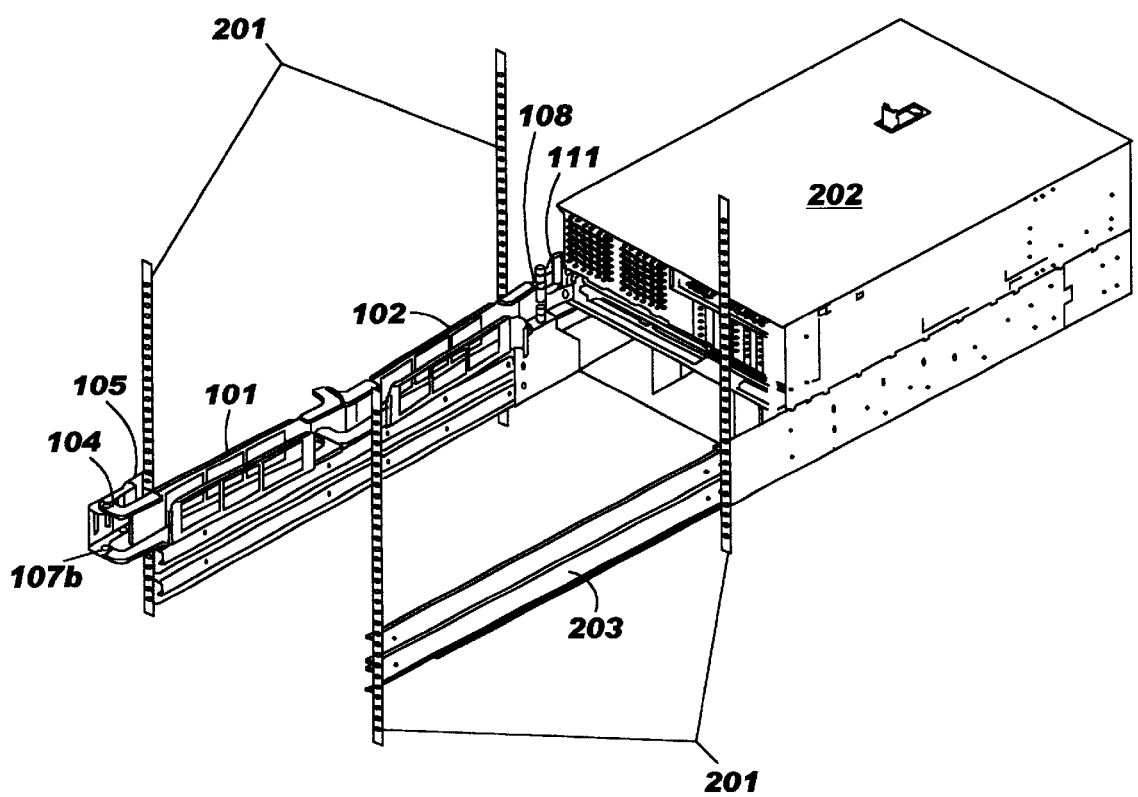
FIG. 4 is a perspective view of an equipment rack, cable management arm assembly, and an equipment unit slidably attached and fully extended from the front of the equipment rack with the cable management arm assembly shown in its "fully extended" position.

The function of the stop means, such as fingers 104a and 104b, and finger 108a, can best be seen with reference to FIG. 2. It should be noted that the joint between cable arms 101 and 102 (i.e., the right end of the cable management arm assembly as seen in FIG. 2) is close to the right rear edge 201a of rack 201. To provide the maximum extension of the cable management arm assembly when equipment unit 202 is fully extended towards the front of rack 201, as illustrated in FIG. 4, each of the cable arms 101 and 102 must be as long as possible. But, if cable arms 101 and 102 are too long, they will strike the right rear side 201a. And the effective length of cable arms 101 and 102 will be extended if hinge plates are allowed to rotate towards right rear edge 201a. Thus, the stop means prevents the rotation of hinge plates 104 and 108 beyond a predetermined angle so that the opposite end of the cable arms does not strike the right rear edge 201a of the rack when the equipment unit is being moved to the fully extended position.

Figure 3:
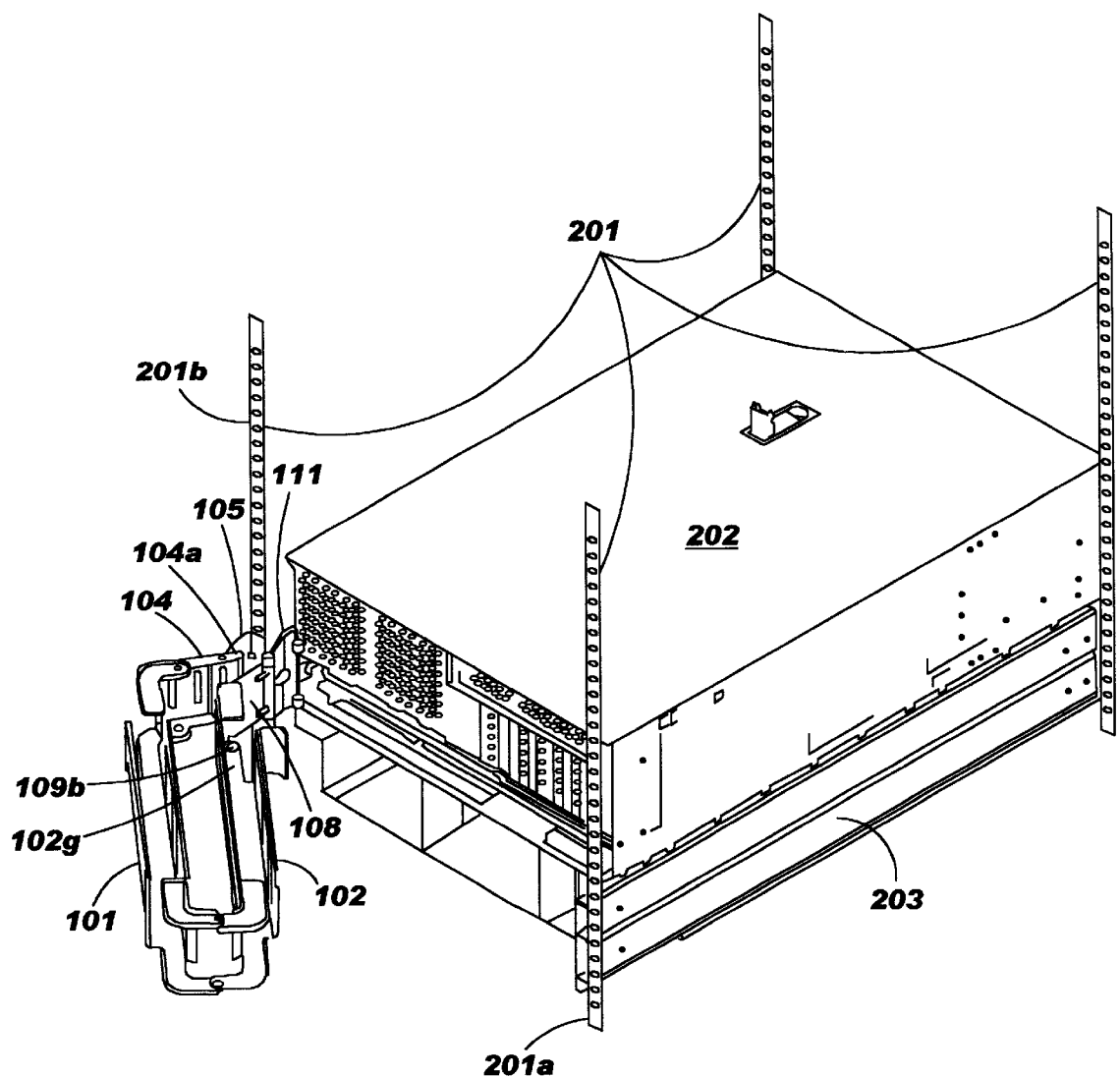
FIG. 3 is a perspective view of an equipment rack, cable management arm assembly, and an equipment unit slidably attached and fully inserted into to the equipment rack with the cable management arm assembly shown in the "service" position, which is rotated away from the back of the equipment unit.

FIG. 3 is a perspective view of a rack and equipment unit in which the equipment unit is in the fully inserted position and the cable management arm assembly is in the "service" position, which means that the arm assembly has been rotated away from the back of the equipment unit, so that service personnel and others can get access to the back end of the equipment unit. Referring to this figure, the purpose of hinge plates 104 and 108 can be seen in that they rotate towards the left edge 201b of rack 201 to permit the arm assembly to move into the service position. Note that the stop means, such as finger 104a, permits movement in this direction as it moves away from rack bracket 105.

FIG. 4 is a perspective view of a rack and equipment unit in which the equipment unit is in the fully extended position, which also pulls the cable management arm assembly into its fully extended position. The length of the cable arms versus the maximum extension of the equipment unit 202 along drawer slide 203 can be selected so that cable arm 101 will never be in alignment with cable arm 102, thereby preventing the arm assembly from locking and permitting the equipment unit to be easily returned to the normal position by simply pushing it in.

We claim as our invention:

1. An electrical equipment rack assembly, comprising:

an electrical equipment rack including a rack attachment bracket;

an electrical equipment unit slidably attached to said rack and having a fully inserted position and a fully extended position, said equipment unit including a unit attachment bracket; and a cable arm assembly having a normal, service and extended position, the cable arm assembly comprising:
      a first cable arm having first and second ends;
      a second cable arm having first and second ends;
      a first joint pivotally attaching the first end of said first cable arm to the first end of said second cable arm;
      a first hinge plate having first and second ends, the first end of said first hinge plate being pivotally attached to said rack attachment bracket, the second end of said first hinge plate being pivotally attached to the second end of said first cable arm;
      a second hinge plate having first and second ends, the first end of said second hinge plate being pivotally attached to said unit attachment bracket, the second end of said second hinge plate being pivotally attached to the second end of said second cable arm; and
      said first hinge plate including a first stop means for limiting the rotation of said first hinge plate relative to said rack attachment bracket; wherein:

when said equipment unit is in said fully inserted position, said cable arm assembly can be positioned in either said normal position wherein said cable arm assembly is positioned adjacent said equipment unit, or in said service position wherein said cable arm assembly is positioned away from said equipment unit; and when said equipment unit is in said fully extended position, said cable arm assembly is in said extended position.

2. The rack assembly of claim 1, wherein said second hinge plate includes a second stop means for limiting the rotation of said first hinge plate relative to said unit attachment bracket.

3. The rack assembly of claim 2, wherein said first joint includes first and second offset brackets coupled, respectively, to said first ends of said first and second cable arms, said offset brackets creating a minimum bend radius at said first joint.

4. The rack assembly of claim 3, wherein:

said first stop means includes a first finger extending from said first hinge plate and contacting said rack attachment bracket to limit the rotation of said first hinge plate; and said second stop means includes a second finger extending from said second hinge plate and contacting said unit attachment bracket to limit the rotation of said second hinge plate.

5. The rack assembly of claim 1, wherein said first joint includes first and second offset brackets coupled, respectively, to said first ends of said first and second cable arms, said offset brackets creating a minimum bend radius at said first joint.

6. The rack assembly of claim 5, wherein said first stop means includes a finger extending from said first hinge plate and contacting said rack attachment bracket to limit the rotation of said first hinge plate.

7. The rack assembly of claim 6, further comprising a quick release hinge pin for attaching said second hinge plate to said unit attachment bracket.

8. The rack assembly of claim 1, wherein said first stop means includes a finger extending from said first hinge plate and contacting said rack attachment bracket to limit the rotation of said first hinge plate.

9. The rack assembly of claim 1, further comprising a quick release hinge pin for attaching said second hinge plate to said unit attachment bracket.

10. A cable arm assembly, for use with an electrical equipment rack including a rack attachment bracket and an electrical equipment unit slidably attached to the rack, the equipment unit including a unit attachment bracket, said cable arm assembly comprising:

a first cable arm having first and second ends;

a second cable arm having first and second ends;

a first joint pivotally attaching the first end of said first cable arm to the first end of said second cable arm;

a first hinge plate having first and second ends, the first end of said first hinge plate being pivotally attachable to the rack attachment bracket, the second end of said first hinge plate being pivotally attached to the second end of said first cable arm;

a second hinge plate having first and second ends, the first end of said second hinge plate being pivotally attachable to the unit attachment bracket, the second end of said second hinge plate being pivotally attached to the second end of said second cable arm; and said first hinge plate including a first stop means for limiting the rotation of said first hinge plate relative to the rack attachment bracket.

11. The cable arm assembly of claim 10, wherein said second hinge plate includes a second stop means for limiting the rotation of said first hinge plate relative to the unit attachment bracket.

12. The cable arm assembly of claim 11, wherein said first joint includes first and second offset brackets coupled, respectively, to said first ends of said first and second cable arms, said offset brackets creating a minimum bend radius at said first joint.

13. The cable arm assembly of claim 12, wherein:

said first stop means includes a first finger extending from said first hinge plate for contacting the rack attachment bracket to limit the rotation of said first hinge plate; and said second stop means includes a second finger extending from said second hinge plate for contacting said unit attachment bracket to limit the rotation of said second hinge plate.

14. The cable arm assembly of claim 10, wherein said first joint includes first and second offset brackets coupled, respectively, to said first ends of said first and second cable arms, said offset brackets creating a minimum bend radius at said first joint.

15. The cable arm assembly of claim 14, wherein said first stop means includes a finger extending from said first hinge plate for contacting the rack attachment bracket to limit the rotation of said first hinge plate.

16. The cable arm assembly of claim 15, further comprising a quick release hinge pin for attaching said second hinge plate to the unit attachment bracket.

17. The cable arm assembly of claim 10, wherein said first stop means includes a finger extending from said first hinge plate for contacting the rack attachment bracket to limit the rotation of said first hinge plate.

18. The cable arm assembly of claim 10, further comprising a quick release hinge pin for attaching said second hinge plate to the unit attachment bracket.

* * * * *